US009673573B2

(12) United States Patent
Spiegel et al.

(10) Patent No.: US 9,673,573 B2
(45) Date of Patent: Jun. 6, 2017

(54) CONNECTOR WITH SENSOR

(71) Applicant: Molex, LLC, Lisle, IL (US)

(72) Inventors: Marko Spiegel, LaFox, IL (US);
Daniel G. Achammer, Warrenville, IL (US); Christopher Blount, Naperville, IL (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 14/916,820

(22) PCT Filed: Sep. 10, 2014

(86) PCT No.: PCT/US2014/055023
§ 371 (c)(1),
(2) Date: Mar. 4, 2016

(87) PCT Pub. No.: WO2015/038664
PCT Pub. Date: Mar. 19, 2015

(65) Prior Publication Data
US 2016/0226197 A1    Aug. 4, 2016

Related U.S. Application Data

(60) Provisional application No. 61/876,017, filed on Sep. 10, 2013, provisional application No. 61/903,493, filed on Nov. 13, 2013.

(51) Int. Cl.
| | | |
|---|---|---|
| *G01R 1/20* | (2006.01) | |
| *H01R 13/66* | (2006.01) | |
| *G01R 15/20* | (2006.01) | |
| *G01R 21/06* | (2006.01) | |
| *G01R 15/14* | (2006.01) | |
| *H01R 13/11* | (2006.01) | |

(Continued)

(52) U.S. Cl.
CPC ....... *H01R 13/6683* (2013.01); *G01R 15/202* (2013.01); *G01R 15/207* (2013.01); *G01R 21/06* (2013.01); *G01R 15/146* (2013.01); *H01R 13/111* (2013.01); *H01R 13/405* (2013.01); *H01R 2101/00* (2013.01)

(58) Field of Classification Search
CPC ...... G01R 15/20; G01R 21/08; G01R 33/075; G05G 2009/04755; G06G 7/162
See application file for complete search history.

(56) References Cited

U.S. PATENT DOCUMENTS

| | | |
|---|---|---|
| 4,675,255 A | 6/1987 | Pfeifer et al. |
| 5,552,700 A | 9/1996 | Tanabe et al. |

(Continued)

FOREIGN PATENT DOCUMENTS

| | | |
|---|---|---|
| DE | 20 2007 018306 U1 | 4/2008 |
| JP | 2012-042409 A | 3/2012 |
| WO | WO 2006/125407 A1 | 11/2006 |

*Primary Examiner* — Tung X Nguyen
(74) *Attorney, Agent, or Firm* — James A. O'Malley

(57) ABSTRACT

A connector includes a housing that supports a core (which can be magnetic) and provides an inner channel. A power terminal is positioned in the inner channel and provides an electrical path between two opposite sides of the housing. The housing further support a sensor that is positioned in a gap in the core. The housing provides electrical isolation between the core and the power terminal. The connector can therefore provide both a power terminal and the ability to sense current in an integrated design.

18 Claims, 17 Drawing Sheets

(51) Int. Cl.
*H01R 13/405* (2006.01)
*H01R 101/00* (2006.01)

(56) References Cited

U.S. PATENT DOCUMENTS

| | | |
|---|---|---|
| 9,358,939 B2 | 6/2016 | Ohashi et al. |
| 9,413,118 B2 | 8/2016 | Suzuki et al. |
| 2003/0169031 A1 | 9/2003 | Viola |
| 2004/0080308 A1 | 4/2004 | Goto |
| 2004/0263151 A1* | 12/2004 | Zein ............... G01R 15/20 324/126 |
| 2005/0007095 A1* | 1/2005 | Cattaneo ........... G01R 15/20 324/117 R |
| 2006/0232262 A1 | 10/2006 | Tanizawa et al. |
| 2010/0315066 A1* | 12/2010 | Hashio ........... G01R 1/06788 324/156 |
| 2011/0116197 A1* | 5/2011 | Zylstra ........... G01R 15/183 361/42 |
| 2013/0207638 A1 | 8/2013 | Gross et al. |
| 2014/0225593 A1 | 8/2014 | Nakajima et al. |
| 2014/0253100 A1 | 9/2014 | Lepine et al. |
| 2016/0041204 A1* | 2/2016 | Bietz ............... G01R 15/18 324/127 |

\* cited by examiner

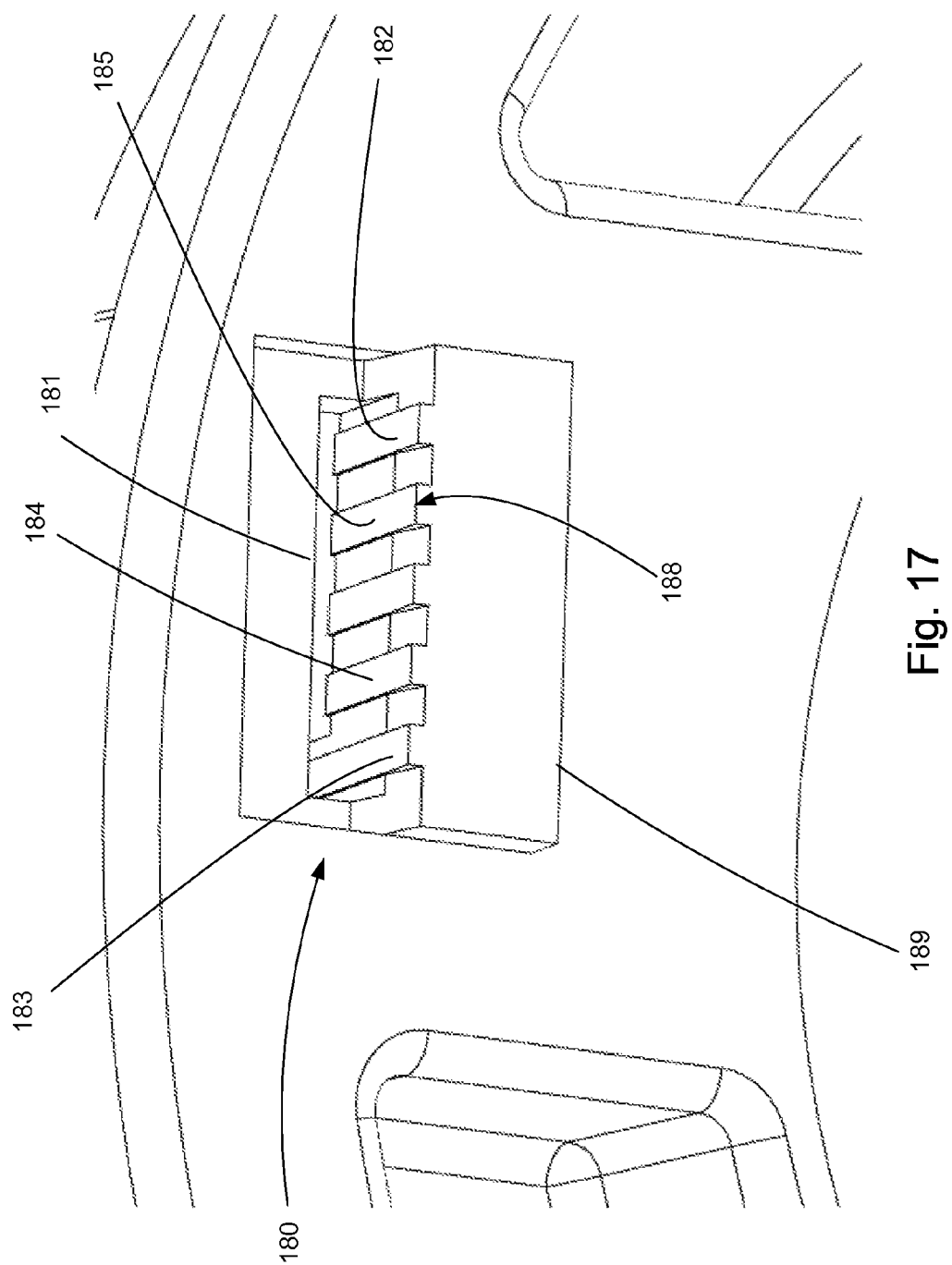

CONNECTOR WITH SENSOR

RELATED APPLICATIONS

This application claims priority to U.S. Provisional Application No. 61/876,017 filed Sep. 10, 2013 and to U.S. Provisional Application No. 61/903,493, filed Nov. 13, 2013, both of which are incorporated herein by reference in their entirety.

TECHNICAL FIELD

This disclosure relates to the field of connectors, more specifically to a connector that can provide feedback regarding its state of operation.

DESCRIPTION OF RELATED ART

Sensors are known to be useful in providing feedback on operating conditions. For example, current sensors are commonly used in applications where it is helpful to monitor current. One common such sensor is a Hall effect sensor, which is commonly used to measure current. Existing Hall effect sensor designs, however, tend to be expensive and bulky. Therefore, certain individuals would appreciate an improved connector with a sensor that can be used to provide feedback regarding operating conditions of the sensor.

SUMMARY

A connector is configured with a sensor that can detect energy. The sensor is integrated into a connector with a housing. In an embodiment the sensor is a Hall effect sensor. The housing includes a first frame and a second frame that together form an inner channel that receives a power terminal. The first and second frames support a core that extends in a circular manner around the inner channel and the core can be magnetic. As can be appreciated, the construction of the core allows the sensor to function appropriately and the housing provides electrical isolation between the core and the power terminal. The core can include one or more gaps and the sensor can be positioned in one of the gaps in the core. The power terminal extends through the inner channel (and the core) and provides a conductive path through the connector.

BRIEF DESCRIPTION OF THE DRAWINGS

The present invention is illustrated by way of example and not limited in the accompanying figures in which like reference numerals indicate similar elements and in which:

FIG. 17 illustrates an enlarged perspective view of a second frame, depicting an embodiment of an integrated connector.

DETAILED DESCRIPTION

Figure 1:
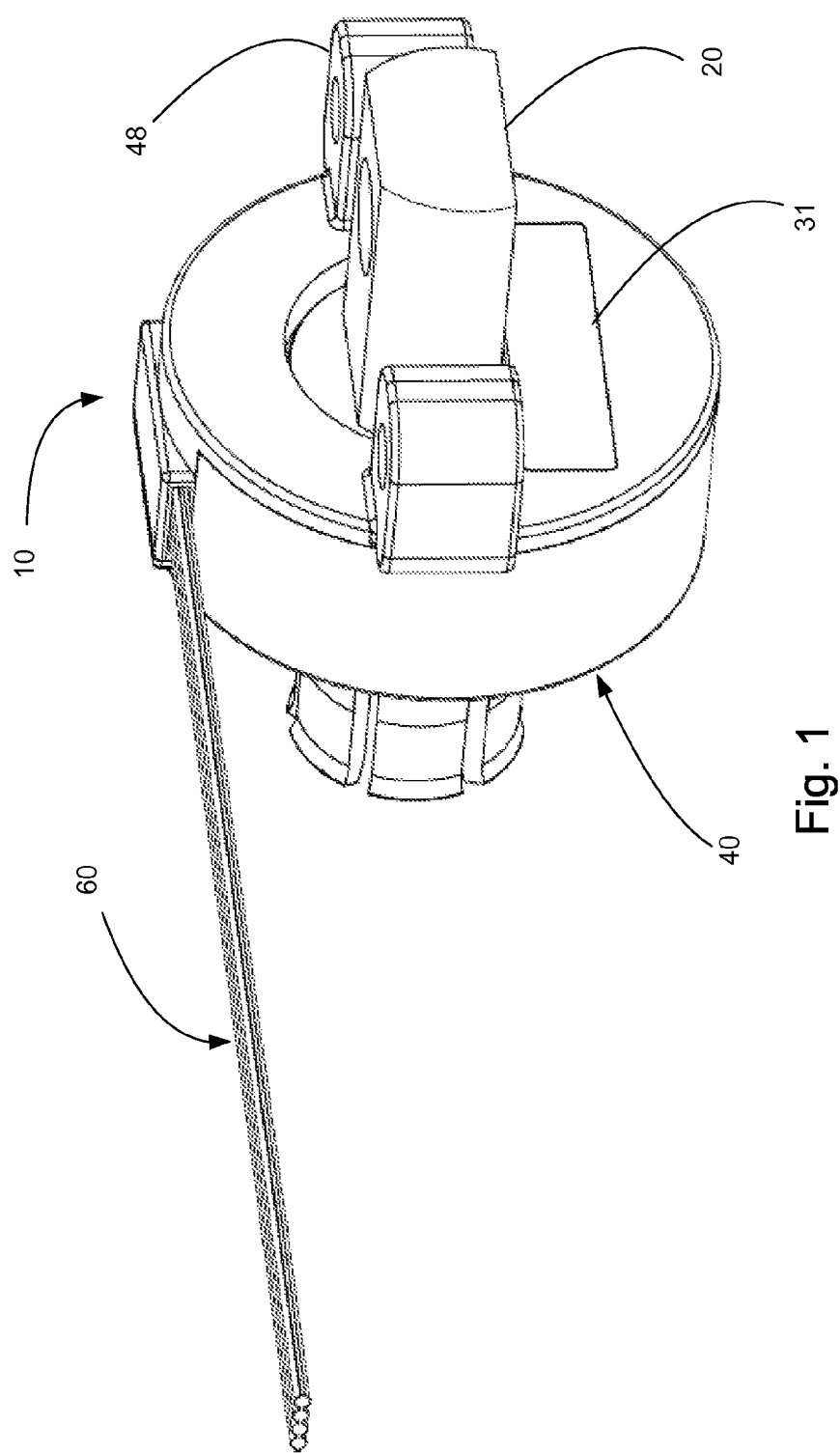
FIG. 1 illustrates a perspective view of an embodiment of a connector.
Figure 2:
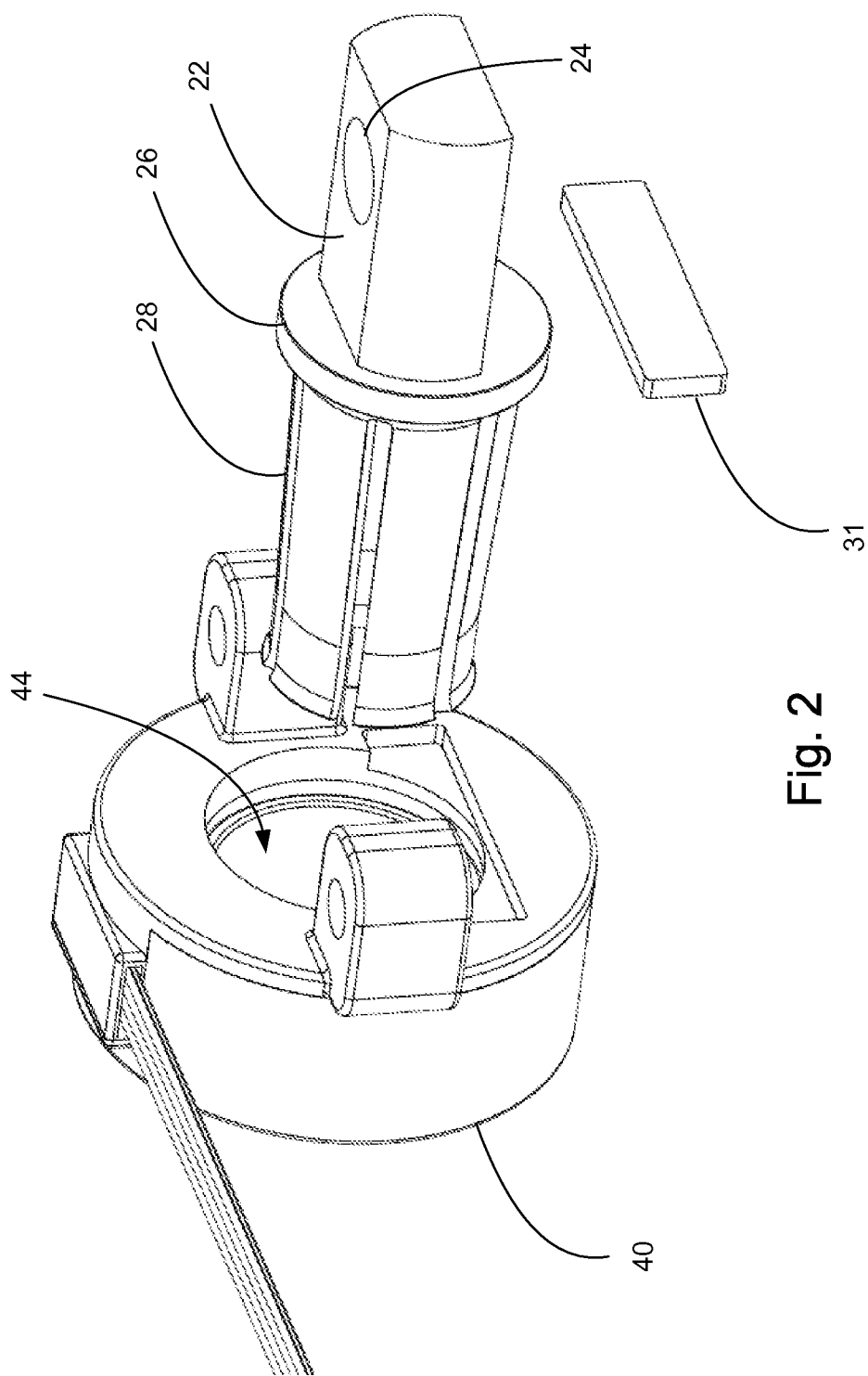
FIG. 2 illustrates a partially exploded perspective view of the embodiment depicted in FIG. 1.
Figure 3:
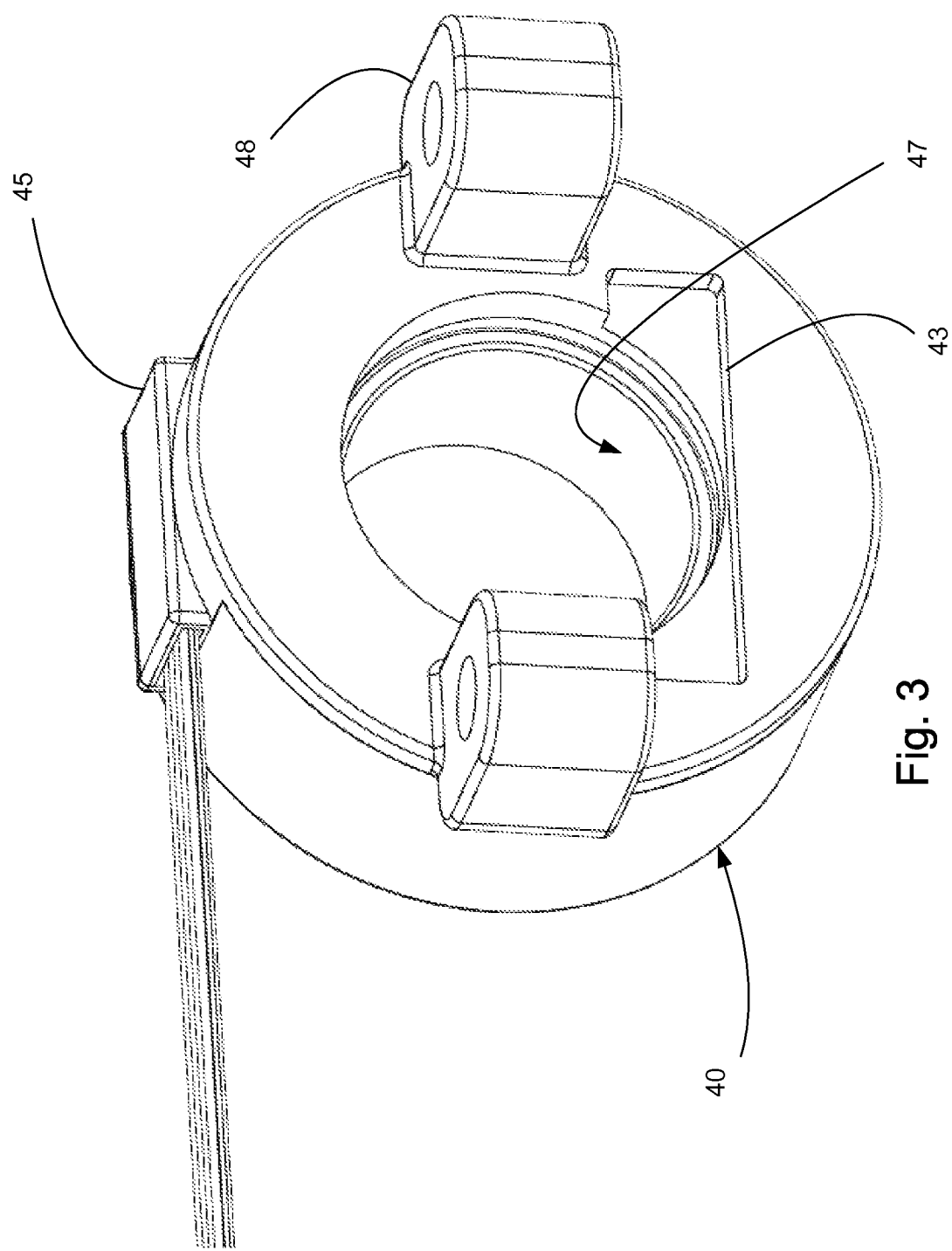
FIG. 3 illustrates a perspective view of the housing depicted in FIG. 1.
Figure 4:
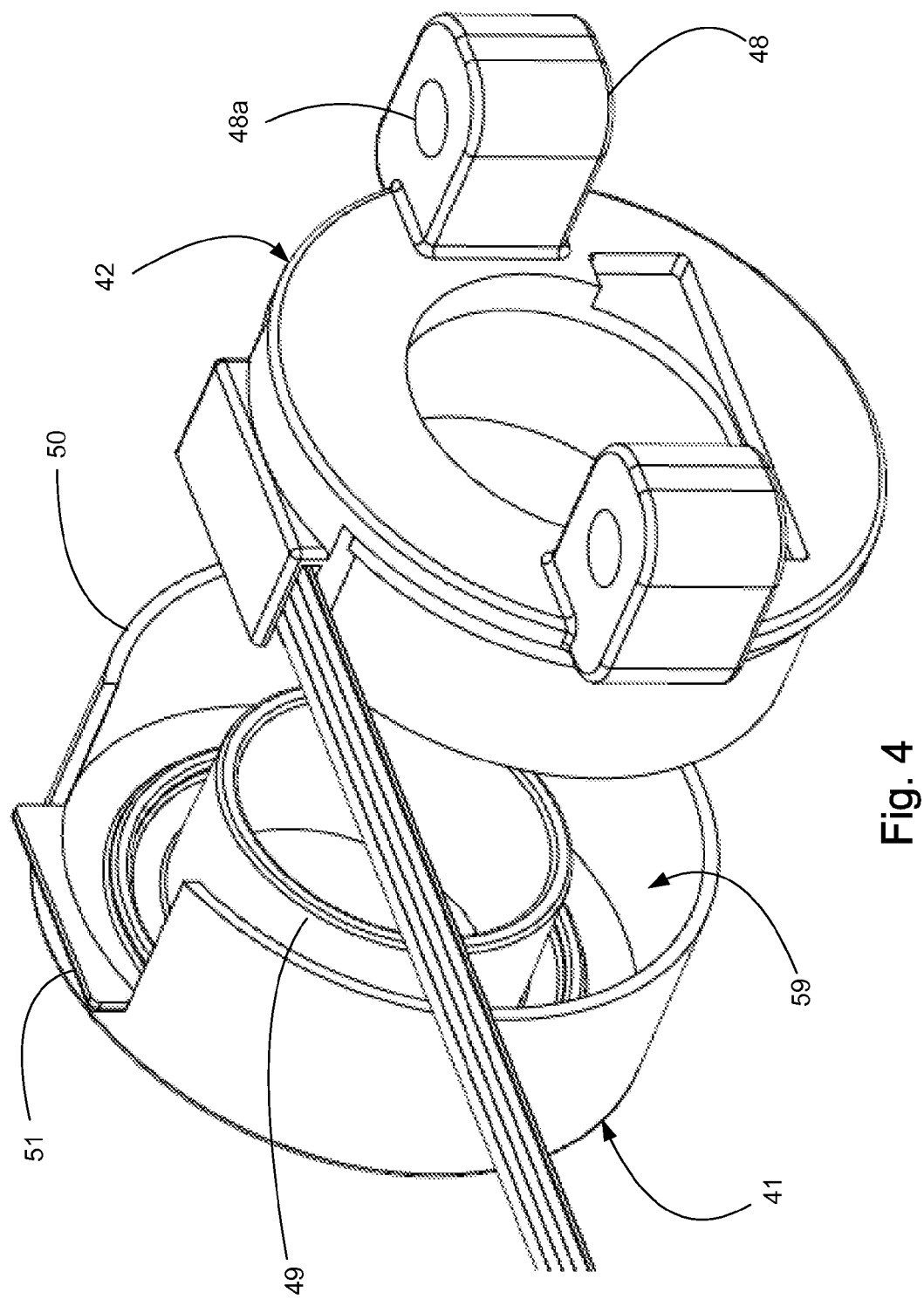
FIG. 4 illustrates a partially exploded perspective view of the embodiment depicted in FIG. 3.
Figure 5:
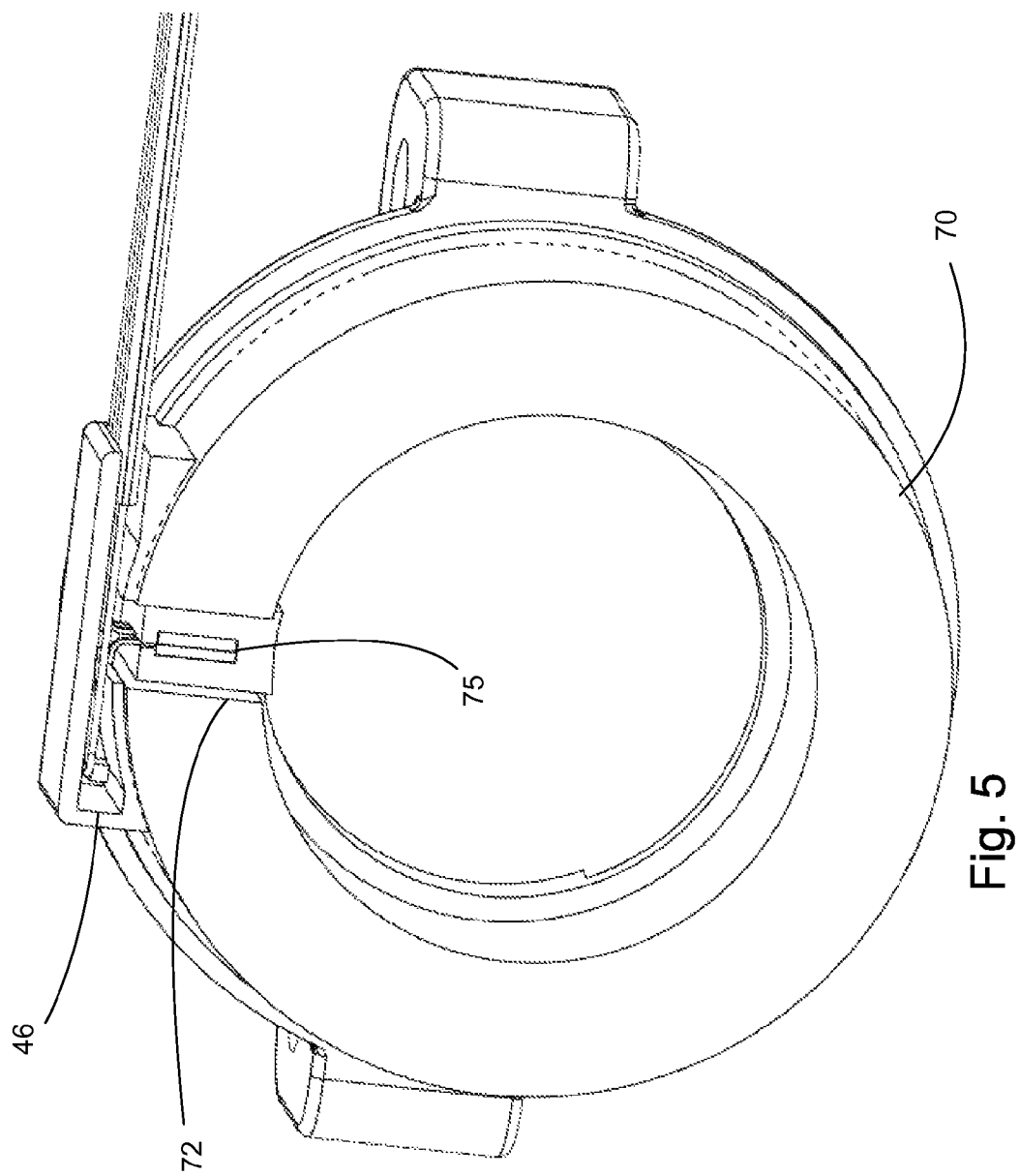
FIG. 5 illustrates a simplified perspective view of the embodiment depicted in FIG. 4.
Figure 6:
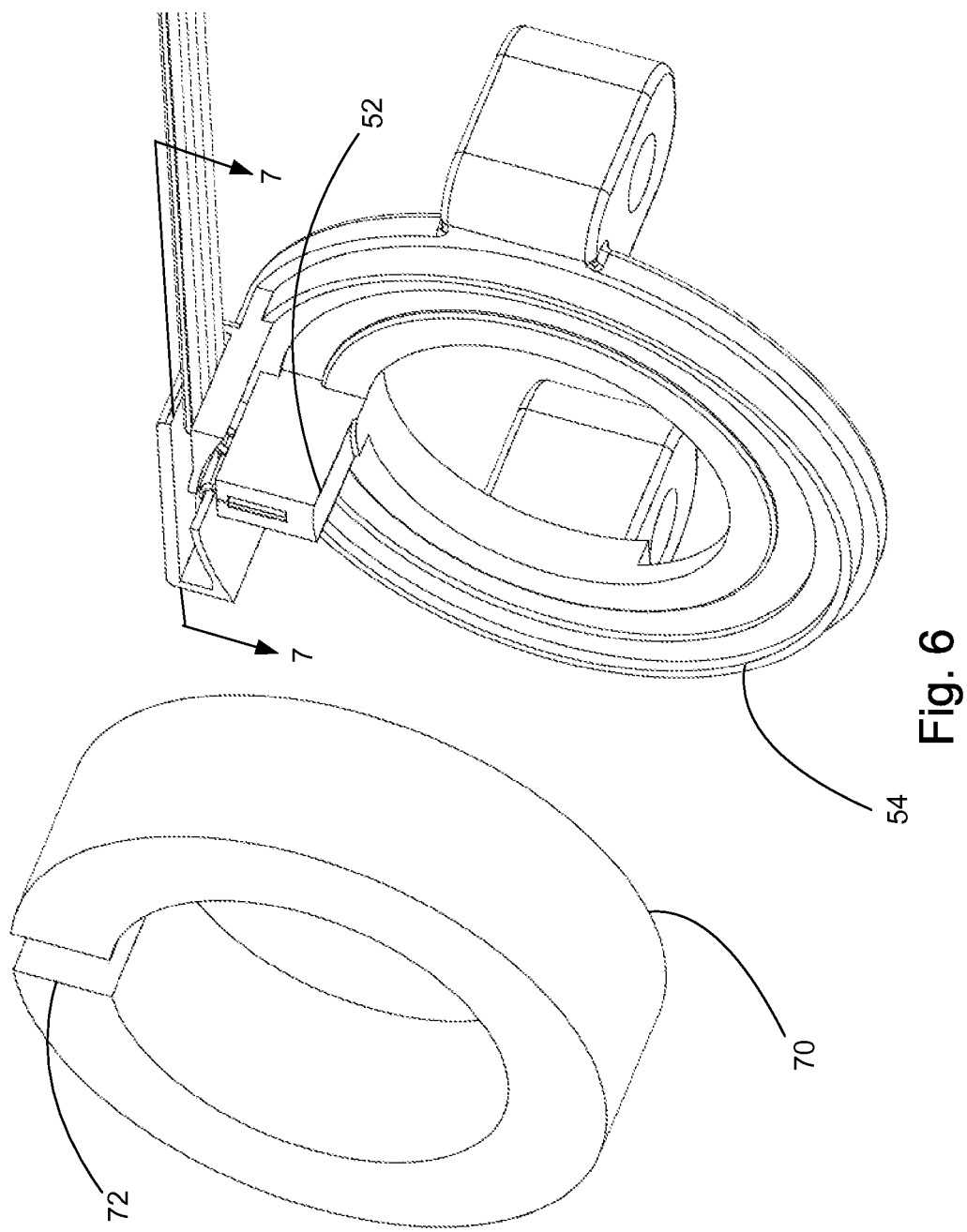
FIG. 6 illustrates a partially exploded perspective view of the embodiment depicted in FIG. 5.
Figure 7:
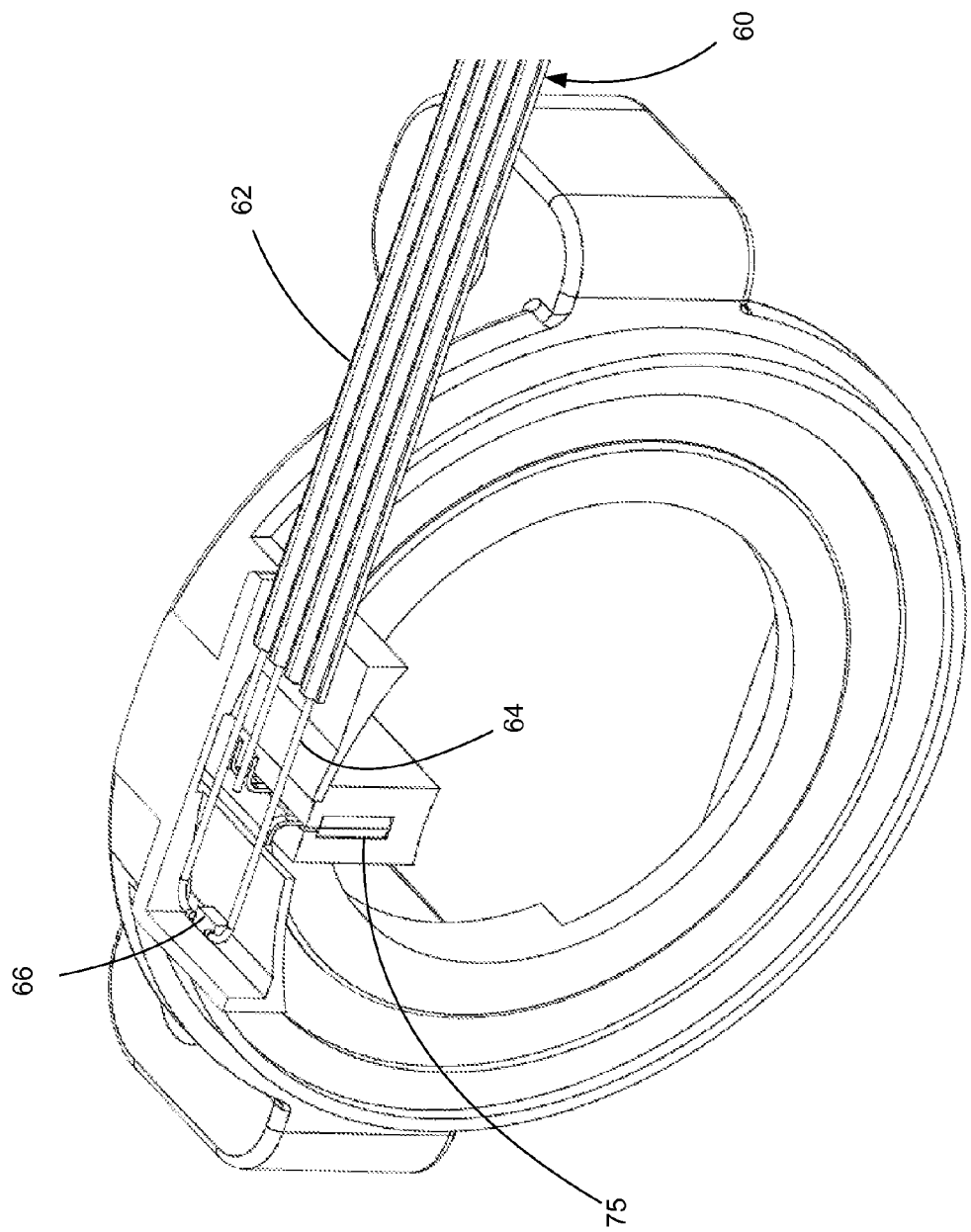
FIG. 7 illustrates a perspective view of a cross section taken along line 7-7 in FIG. 6.
Figure 8:
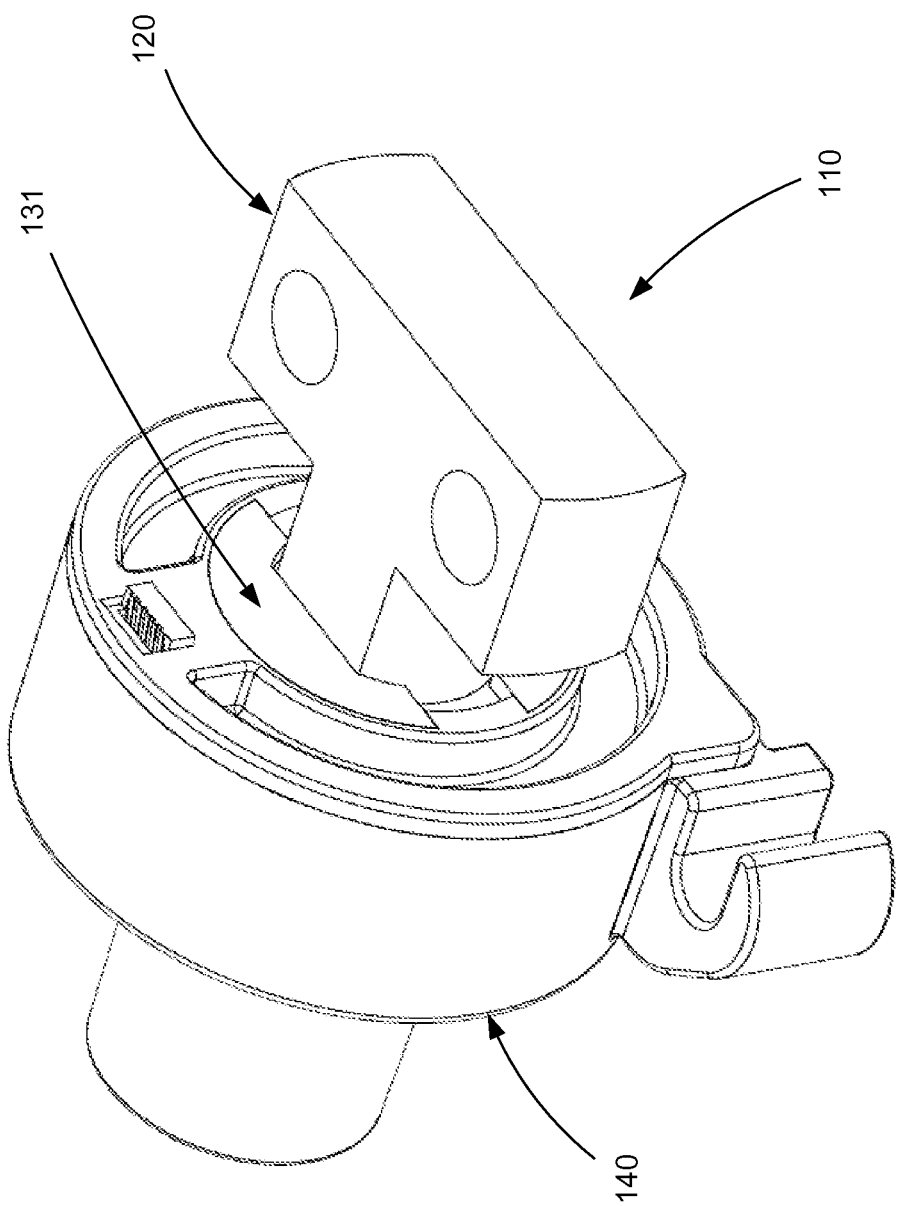
FIG. 8 illustrates a perspective view of another embodiment of a connector.

The detailed description that follows describes exemplary embodiments and is not intended to be limited to the expressly disclosed combination(s). Therefore, unless otherwise noted, features disclosed herein may be combined together to form additional combinations that were not otherwise shown for purposes of brevity.

The features depicted in FIGS. 1-7 illustrate a first embodiment of a connector 10 with an integrated sensor that can be used to provide power and sensing capabilities such as current or power. As can be appreciated, the ability to sense power delivery can be useful in situations where feedback is desirable. It should be noted that while a Hall effect sensor is being used in the depicted embodiments other types of sensors suitable for use in detecting power delivery and/or voltage can used as desired, depending on what attribute needs to be monitored.

The connector 10 includes a housing 40 that supports a power terminal 20 and includes a cable 60 that extends into a sensor block 45 extending from the housing 40. The cable 60 can include a plurality of conductors 64 that are protected by an insulative layer 62. The housing 40 can use a locking block 31 positioned in recess 43 to help hold the power terminal 20 in position and the locking block 31 can be heat staked, adhered, welded or otherwise secured into the recess 43 so as to help retain the power terminal 20 in position. The power terminal 20 includes a mounting block 22 with a fastener aperture 24 on one side of a retaining lip 26 and on another side of the retaining lip 26 is a plurality of power beams 28 that are configured to engage a mating terminal (not shown). The power beams 28 can be configured to engage a circular shaped mating terminal (as depicted) or could be shaped to engage some other shape of mating terminal.

The housing 40 includes a first frame 41 and a second frame 42. The power terminal 20 is configured to be positioned in inner channel 44 of the first frame 41 and the housing 40 can be secured by retention tabs 48 (which can include an opening 48a to allow the retention tab 48 be secured with a fastener). The inner channel 44 includes an inner surface 47, which is provided by inner wall 49 of first frame 41. The first frame 41 also includes an outer frame 50. As depicted, the inner and outer frames 41, 42 are curved so as to form a slot 59 that is circular shaped. The first frame 41 also includes a secondary wall 51 that acts to close the sensor block 45. The slot 59 extends around core 70 and helps ensure the core 70 is retained in a desired position. As can be appreciated, the core 70 includes a gap 72 that is aligned with sensor support 52 that is supported by the second frame 42. The second frame 42 can also include a lip 54 that helps hold the core 70 in position. Thus, the core 70 can be positioned between the first and second frames 41, 42 and held in a secure manner so at to provide electrical isolation.

The sensor block 45 is aligned with the sensor support 52 and provides a cavity 46 that allows the conductors 64 to be electrically connected to the sensor 75. The connection can be via solder or conductive adhesive or mechanical fasteners (as desired). An additional electrical component 66 (which can be a conventional component such as a capacitor, a resistor, an inductor or a memristor) is shown and additional electrical components can be added as need to provide the appropriate circuit for the sensor.

As can be appreciated, therefore, the connector 10 provides an inner channel 44 that surrounds the power terminal 20 and provides electrical isolation between the power terminal 20 and the core 70. Accordingly, the connector 10 can both support the power terminal 20 and also provide feedback on the amount of current passing through the power terminal 20.

FIGS. 8-17 illustrate an embodiment of a connector 110. Connector 110 can be similar to connector 10 and can include features used in connector 10 when appropriate.

The connector 110 includes a housing 140 that supports a power terminal 120, the power terminal 120 being positioned in an inner channel 144. The depicted power terminal 120 includes a mounting block 122 with at least one fastener aperture 124 on one side of a retaining lip 126 and on another side of the retaining lip 126 is a plurality of power beams 128 that are configured to engage a mating terminal (not shown). It should be noted that a wide range of power terminals can be provided and therefore the depicted power terminals (both with respect to connector 10 and connector 110), while having certain benefits, are not intended to be limiting unless otherwise noted.

Figure 9:
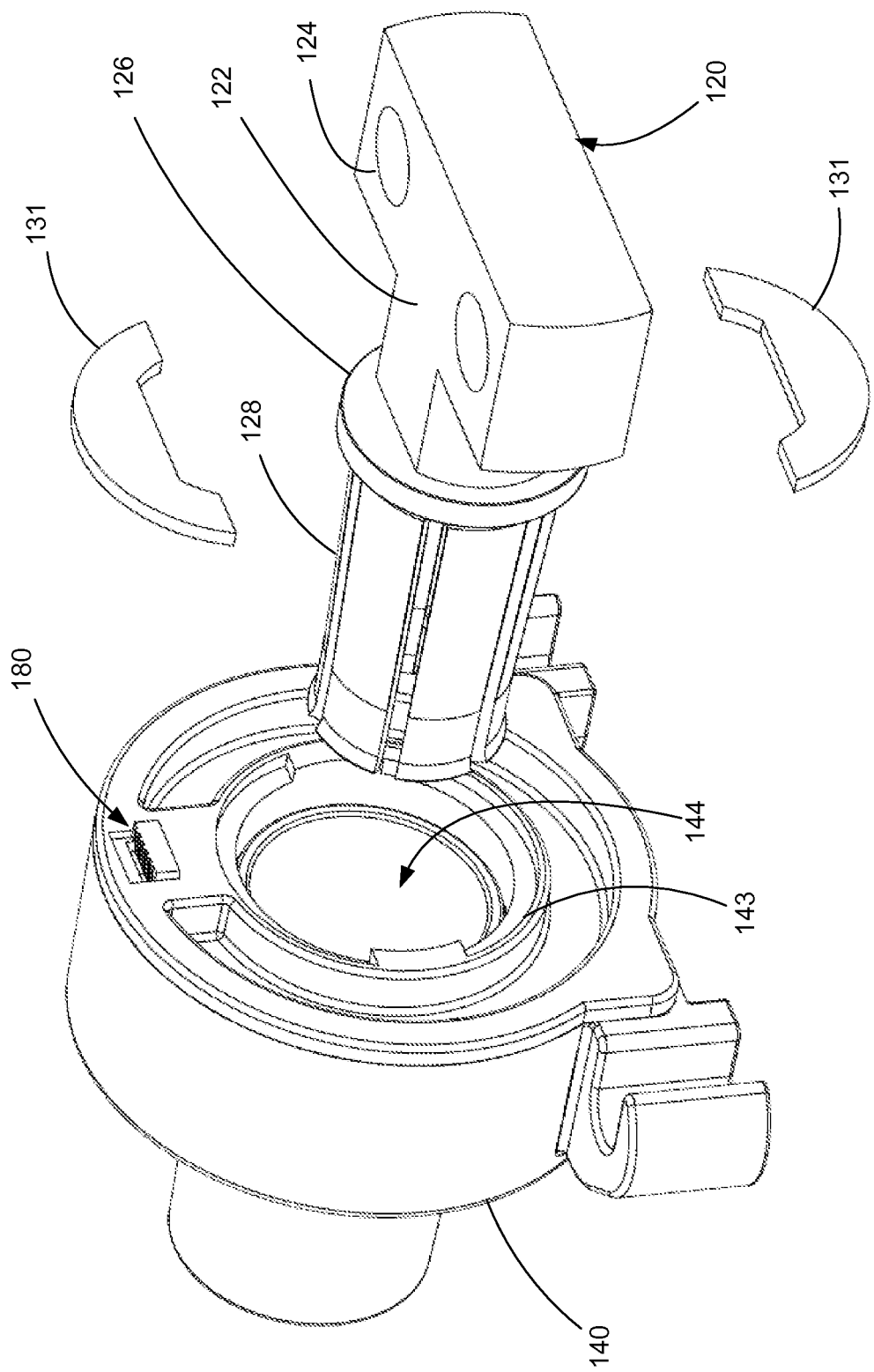
FIG. 9 illustrates a partially exploded perspective view of the embodiment depicted in FIG. 8.
Figure 10:
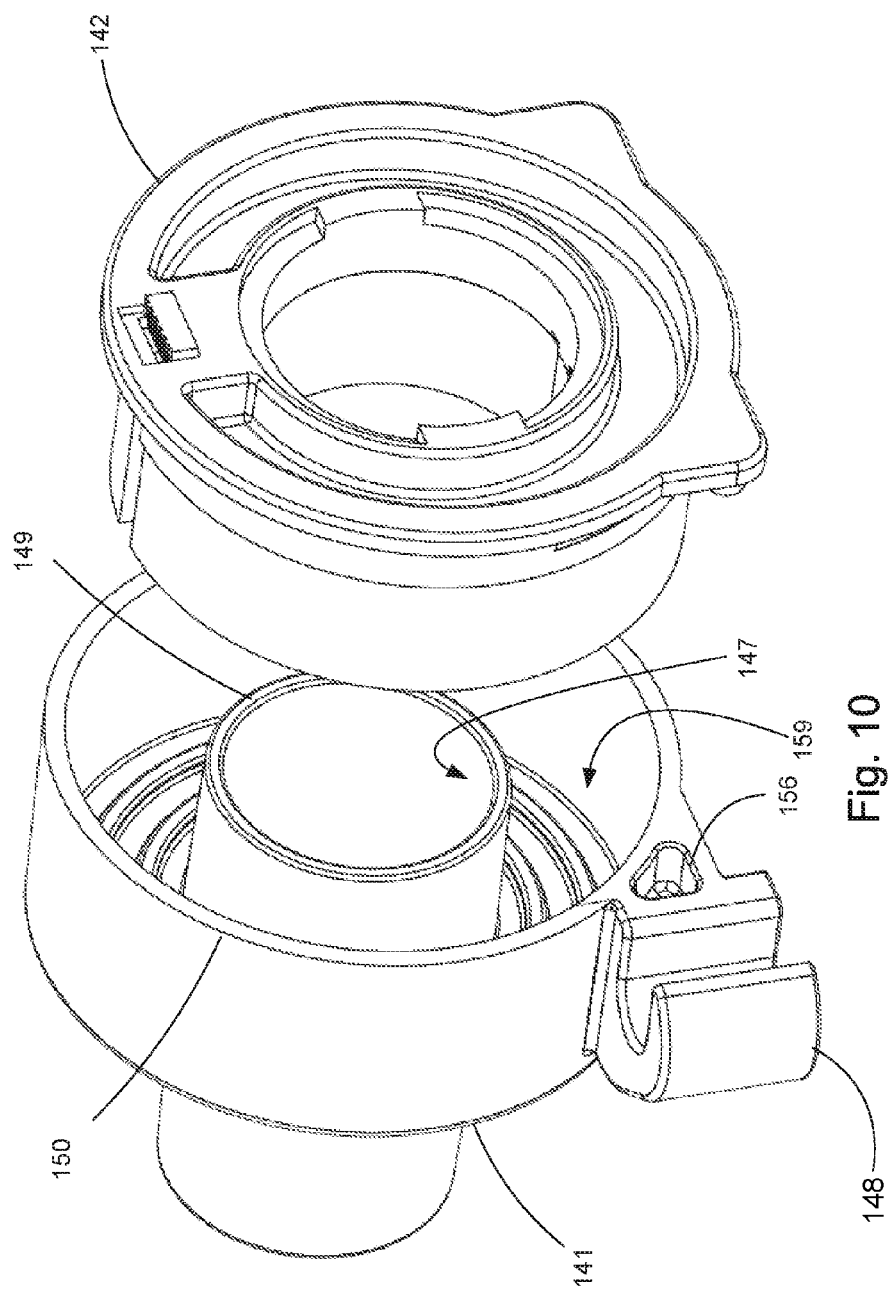
FIG. 10 illustrates a partially exploded perspective view of an embodiment of a housing.
Figure 11:
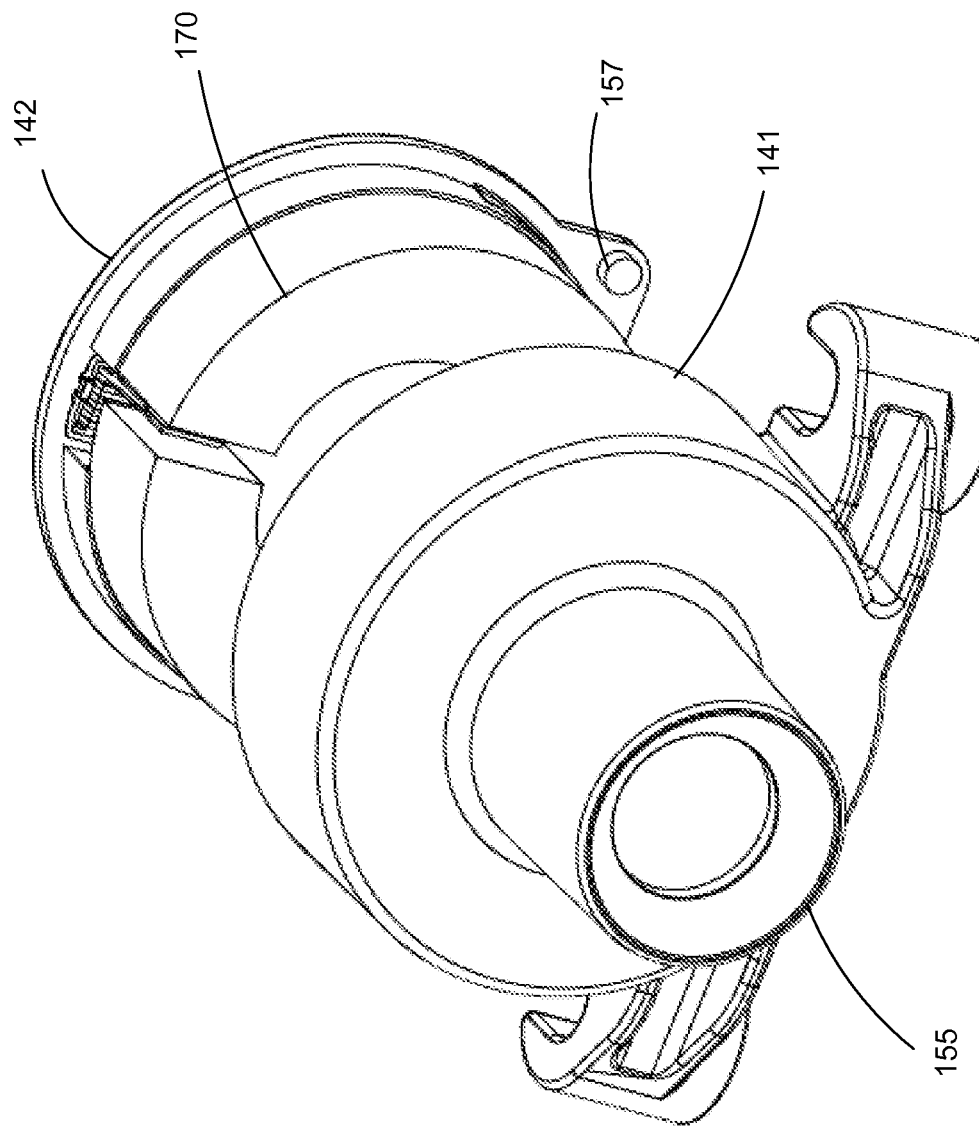
FIG. 11 illustrates another perspective view of the embodiment depicted in FIG. 10.
Figure 12:
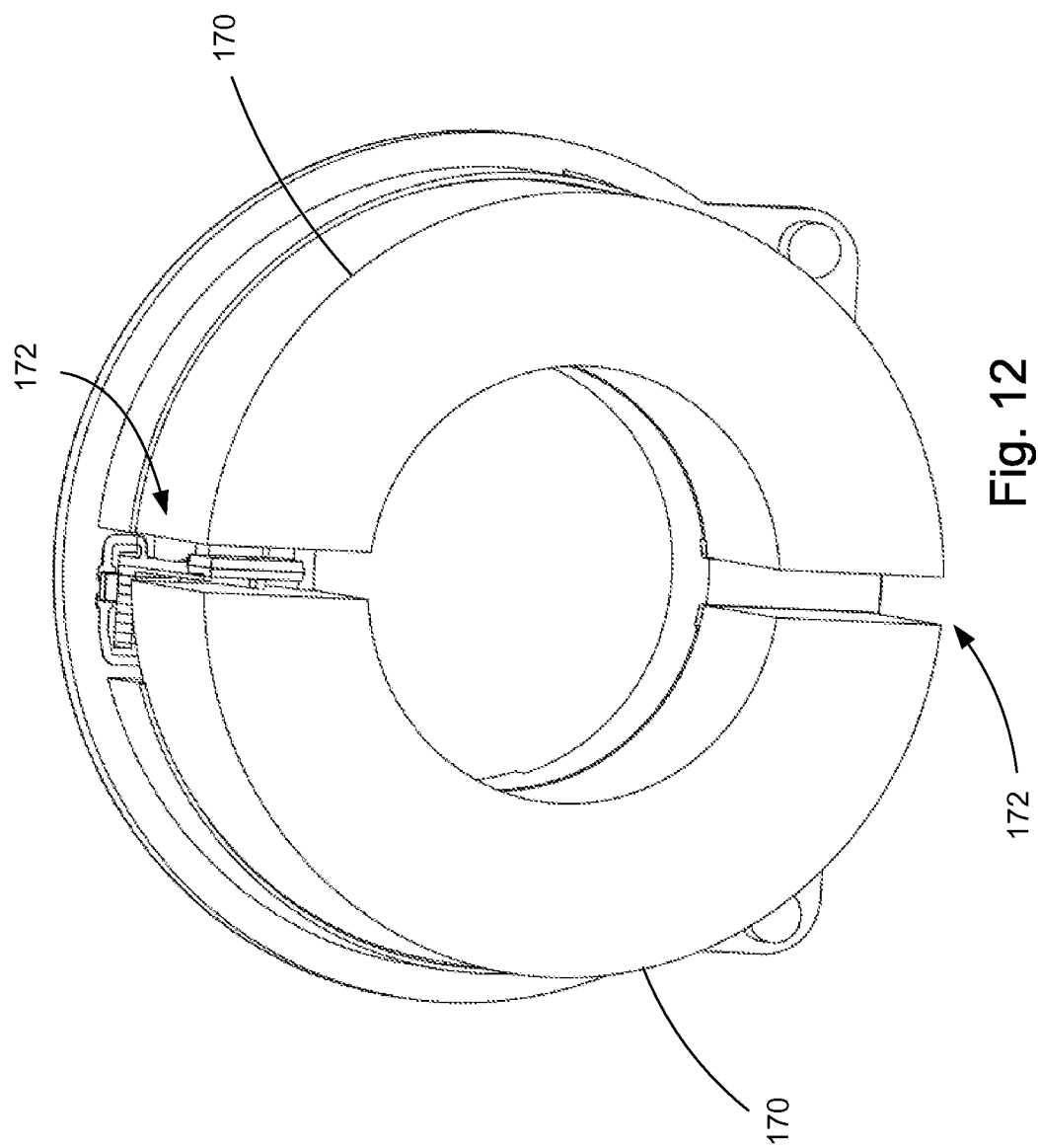
FIG. 12 illustrates a simplified perspective view of the embodiment depicted in FIG. 11.
Figure 13:
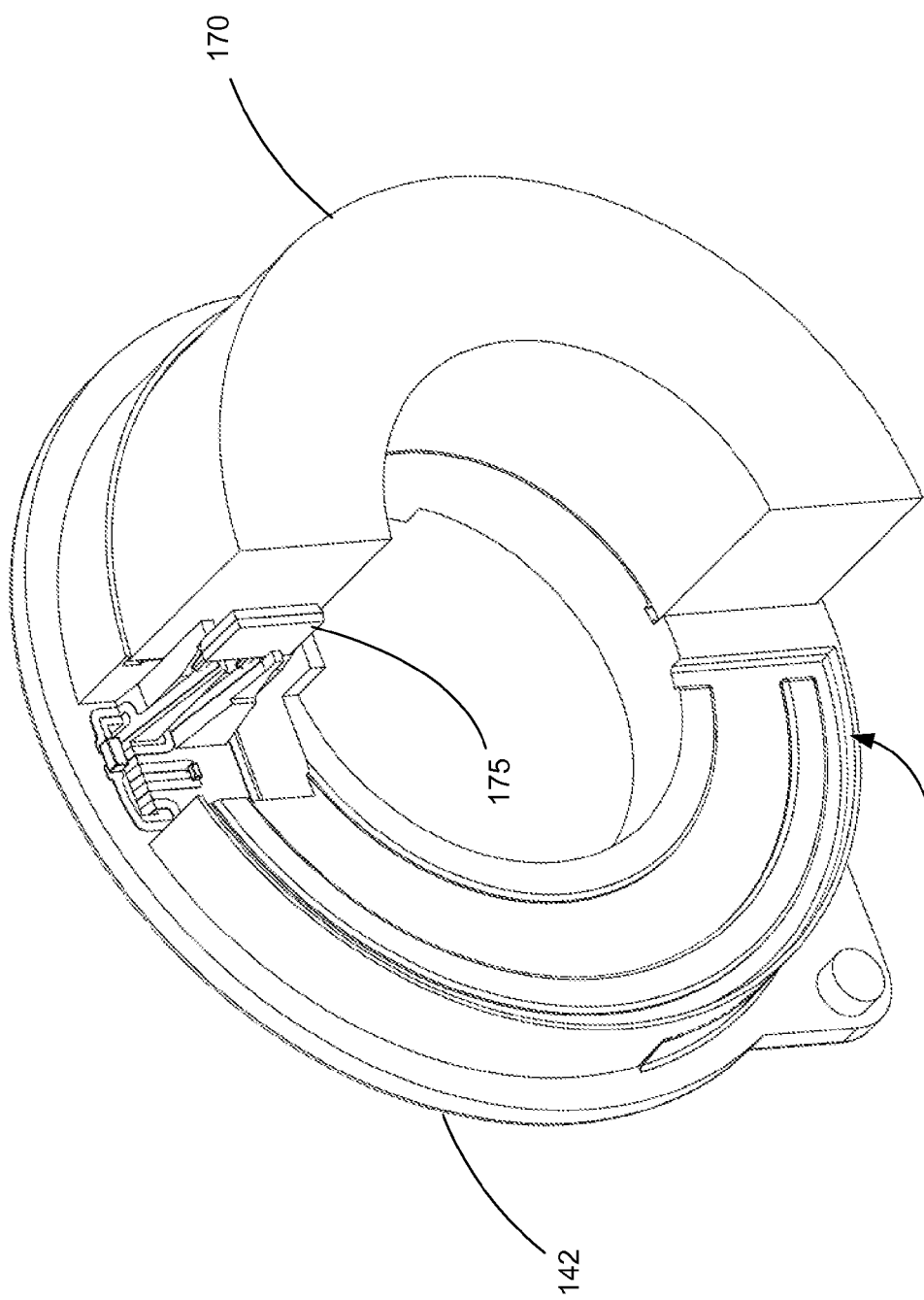
FIG. 13 illustrates a simplified perspective view of the embodiment depicted in FIG. 12.
Figure 14:
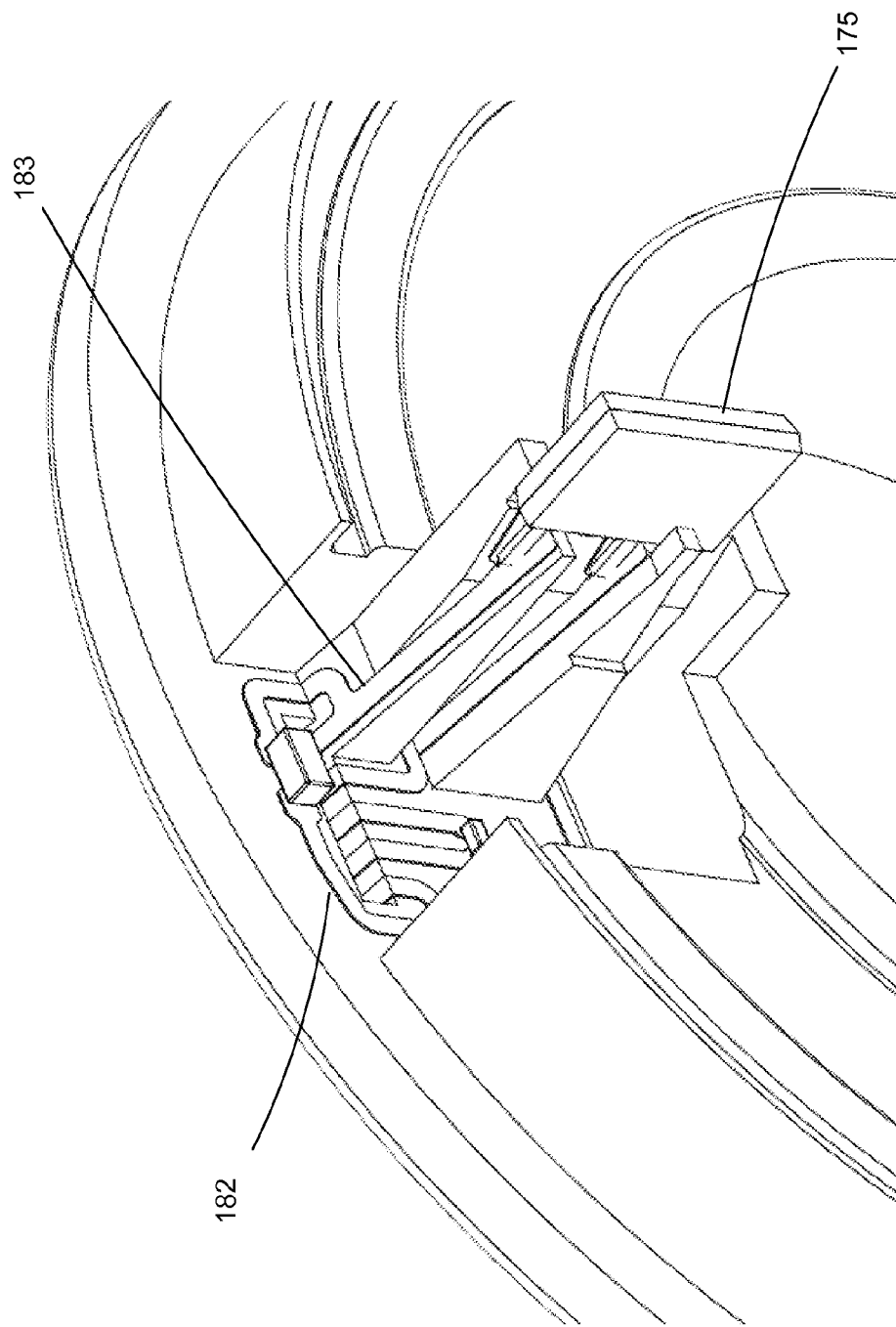
FIG. 14 illustrates an enlarged perspective view of the embodiment depicted in FIG. 13.
Figure 15:
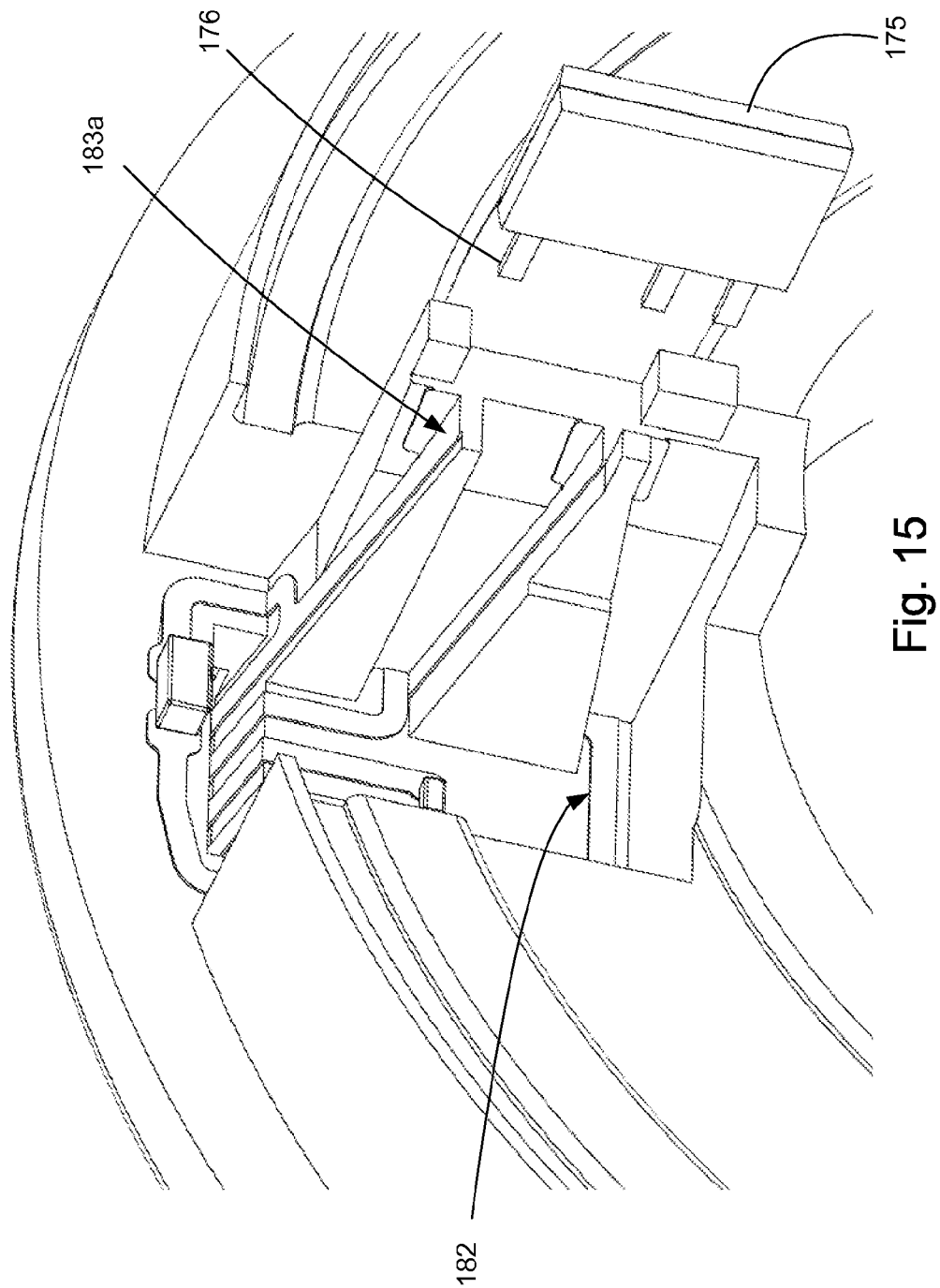
FIG. 15 illustrates a partially exploded perspective view of the embodiment depicted in FIG. 14.
Figure 16:
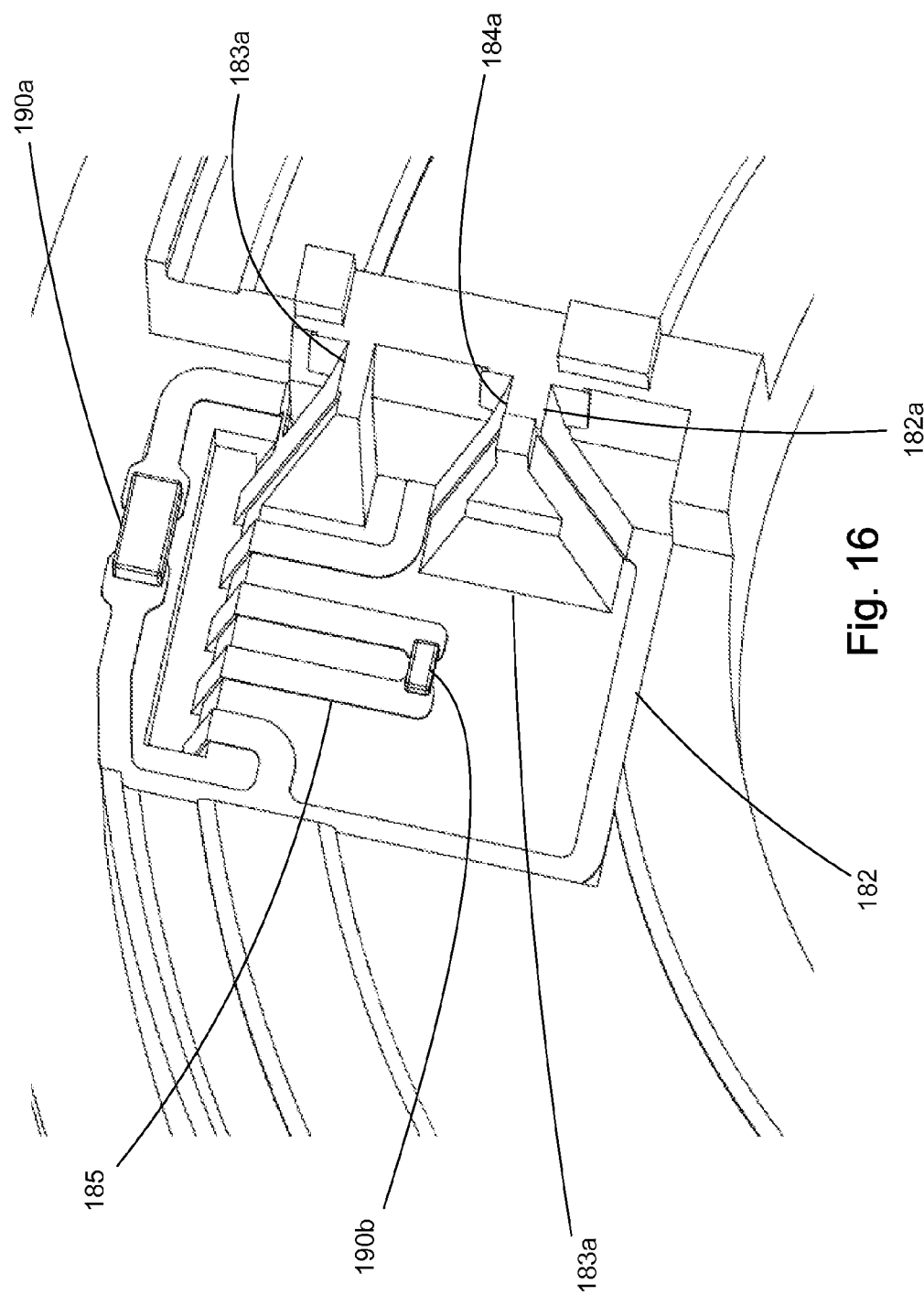
FIG. 16 illustrates a simplified perspective view of the embodiment depicted in FIG. 15 with the sensor omitted.

A locking block 131 is used to help secure the power terminal 120 to the housing 140 and in an embodiment two locking blocks can be used (as depicted in FIG. 9) to provide additional retention. The locking blocks 131 can be secured in recess 143 as discussed above (via heat staked, adhered, welded or otherwise being secured into the recess 143).

The housing 140 includes a first frame 141 and a second frame 142 and includes an integrated connector 180 positioned in the second frame 142. The first frame 141 includes an inner wall 149 and an outer wall 150 that define a slot 159. The inner wall 149 includes a surface 147 that extends around the power terminal 120 and helps provide electrical isolation to the power terminal 120. The first frame 141 includes a nose 155 that protrudes and extends along the power beams 128 and helps cover them. The first frame 141 also includes retention tabs 148 that can be used to hold the housing 140 in the desired positioned.

The first frame 141 includes a notch 156 and the second frame 142 includes a protrusion 157. Thus, the first frame 141 and second frame 142 can be configured to be pressed together. The use of adhesives and or welding or heat staking can also be used to hold the first frame 141 and second frame 142 together.

The second frame 142 includes a lip 154 that supports a core 170, which as depicted includes two gaps 172. A sensor 175 is positioned in one of the gaps 172 and is connected to the integrated connector 180 via terminals 176. The integrated connector includes conductors 182, 183, 184, 185 and additional or fewer conductors can be included, depending on the intended configuration of the sensor 175. As with connector 10, electrical components 190a, 190b can be connected in an appropriate circuit with the sensor 175. The conductors 182, 183, 184, 185 can include contact points 182a, 183a, 184a that can be used to electrically connect to the sensor 175 (e.g., via solder or electrical adhesive). Ribs 188 can be provided to support the conductors 182, 183, 184, 185 and ledge 189 can be formed to provide an alignment feature for the connector 180. As depicted, the conductors 182, 183, 184, 185 are formed by plating traces on a surface of the second frame 142 and extend through an access aperture 181. Alternatively, the traces could be replaced with more conventional terminals.

As can be appreciated, therefore, the connector 110 provides an inner channel 144 that surrounds the power terminal 120 and provides electrical isolation between the power terminal 120 and the core 170. Accordingly, the connector 110 can both support the power terminal 120 and also provide feedback on the amount of current passing through the power terminal 120.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A connector comprising:
a housing with an inner channel;
a power terminal positioned in the inner channel;
a core supported by the housing, the core having at least one gap; and
a sensor supported by the housing and positioned in the at least one gap, wherein the sensor is configured to sense delivery of energy through the power terminal,
wherein the housing includes a first frame and a second frame, the first frame including a slot that helps secure the core, wherein the second frame includes an integrated connector, and wherein the integrated connector includes an access aperture that extends through the first frame and traces are provided on the housing that extend through the aperture.

2. The connector of claim 1, wherein the core is a magnetic core.

3. The connector of claim 1, wherein the sensor is a Hall-effect sensor.

4. The connector of claim 1, wherein the second frame supports the sensor and further includes retention tabs configured to support the housing.

5. The connector of claim 1, further comprising a locking block that secures the power terminal in the housing.

6. A connector comprising:
a housing with an inner channel;
a power terminal positioned in the inner channel, the power terminal including a retaining lip, a mounting block and a plurality of power beams, the retaining lip having first and second sides, the mounting block extending outwardly from the first side of the retaining lip, the plurality of power beams extending outwardly from the second side of the retaining lip, the plurality of power beams being configured to engage a mating terminal;
a core supported by the housing, the core having at least one gap; and a sensor supported by the housing and positioned in the at least one gap, wherein the sensor is configured to sense delivery of energy through the power terminal.

7. The connector of claim 6, wherein the core is a magnetic core.

8. The connector of claim 6, wherein the sensor is a Hall-effect sensor.

9. The connector of claim 6, wherein the housing includes a first frame and a second frame, the first frame including a slot that helps secure the core.

10. The connector of claim 9, wherein the second frame includes an integrated connector.

11. The connector of claim 10, wherein the integrated connector includes an access aperture that extends through the first frame and traces are provided on the housing that extend through the aperture.

12. The connector of claim 9, wherein the second frame supports the sensor and further includes retention tabs configured to support the housing.

13. The connector of claim 6, wherein the first frame has a nose extending therefrom that covers the plurality of power beams.

14. The connector of claim 6, further comprising a locking block that secures the power terminal in the housing.

15. The connector of claim 14, wherein the locking block is positioned to face the first side of the retaining lip of the power terminal.

16. The connector of claim 6, further comprising a sensor block that supports a cable extending from the connector.

17. The connector of claim 16, wherein the housing includes a sensor support that supports the sensor in the gap, and wherein the cable is electrically connected to the sensor in the sensor block.

18. The connector of claim 6, wherein the mounting block has at least one fastener aperture extending therethrough.

* * * * *